US011953838B2

(12) United States Patent
Levy et al.

(10) Patent No.: US 11,953,838 B2
(45) Date of Patent: Apr. 9, 2024

(54) LITHOGRAPHY SUPPORT CLEANING WITH CLEANING SUBSTRATE HAVING CONTROLLED GEOMETRY AND COMPOSITION

(71) Applicant: ASML Holding N.V., Veldhoven (NL)

(72) Inventors: Keane Michael Levy, Wilton, CT (US); Akshay Dipakkumar Harlalka, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/291,322

(22) PCT Filed: Oct. 31, 2019

(86) PCT No.: PCT/EP2019/079934
§ 371 (c)(1),
(2) Date: May 5, 2021

(87) PCT Pub. No.: WO2020/094517
PCT Pub. Date: May 14, 2020

(65) Prior Publication Data
US 2022/0026819 A1  Jan. 27, 2022

Related U.S. Application Data

(60) Provisional application No. 62/912,971, filed on Oct. 9, 2019, provisional application No. 62/757,837, filed on Nov. 9, 2018.

(51) Int. Cl.
G03F 7/00 (2006.01)

(52) U.S. Cl.
CPC .............. *G03F 7/70925* (2013.01)

(58) Field of Classification Search
CPC .......... G03F 7/70925; G03F 7/70916
See application file for complete search history.

(56) References Cited

U.S. PATENT DOCUMENTS

| 5,762,688 A | 6/1998 | Ziger et al. |
| 7,894,037 B2 | 2/2011 | Bleeker et al. |
| 2002/0070355 A1* | 6/2002 | Ota ............... G03F 9/7003 430/311 |

(Continued)

FOREIGN PATENT DOCUMENTS

| CN | 101446770 A | 6/2009 |
| CN | 101765811 A | 6/2010 |

(Continued)

OTHER PUBLICATIONS

Machine translation of WO-2013083332-A1, 2013 (Year: 2013).*

(Continued)

Primary Examiner — Steven Whitesell Gordon
(74) Attorney, Agent, or Firm — Sterne, Kessler, Goldstein & Fox P.L.L.C.

(57) ABSTRACT

Apparatus for and method of removing a contaminant from a working surface of a lithography support such as a reticle or wafer stage in an EUV or a DUV photolithography system in which a cleaning substrate provided with a coating made a selected material and configuration is pressed against the working surface so that the contaminant is transferred from the working surface to the coating.

29 Claims, 11 Drawing Sheets

(56) References Cited

U.S. PATENT DOCUMENTS

| | | | |
|---|---|---|---|
| 2006/0008660 A1* | 1/2006 | Parkhe | B08B 1/00 428/446 |
| 2006/0162739 A1* | 7/2006 | Sogard | G03F 7/70925 134/1 |
| 2007/0103659 A1* | 5/2007 | Yoshitake | B82Y 40/00 355/53 |
| 2007/0163621 A1 | 7/2007 | Ishizaka et al. | |
| 2008/0257383 A1 | 10/2008 | Levinson | |
| 2009/0014030 A1 | 1/2009 | De Jong et al. | |
| 2010/0258144 A1 | 10/2010 | Broz et al. | |
| 2012/0024318 A1 | 2/2012 | Itoh et al. | |
| 2013/0037052 A1 | 2/2013 | Suuronen et al. | |
| 2013/0247935 A1* | 9/2013 | Park | H01L 21/67017 134/1 |
| 2014/0174468 A1* | 6/2014 | Park | B08B 7/0028 134/201 |
| 2014/0226136 A1* | 8/2014 | Gagnon | G03F 1/82 355/30 |
| 2014/0326278 A1 | 11/2014 | Kobayashi et al. | |
| 2015/0107621 A1 | 4/2015 | Kobayashi et al. | |
| 2015/0261104 A1* | 9/2015 | Kamo | G03F 7/70925 134/6 |
| 2017/0194134 A1 | 7/2017 | Oostrom et al. | |

FOREIGN PATENT DOCUMENTS

| | | | |
|---|---|---|---|
| EP | 1093022 A2 | 4/2001 | |
| WO | WO 2013/083332 A1 | 6/2013 | |
| WO | WO-2013083332 A1 * | 6/2013 | ......... G03F 7/70925 |

OTHER PUBLICATIONS

International Search Report and Written Opinion of the International Searching Authority directed to related International Patent Application No. PCT/EP2019/079934, dated Feb. 11, 2020; 12 pages.

International Preliminary Report on Patentability directed to related International Patent Application No. PCT/EP2019/079934, dated May 11, 2021; 10 pages.

Research Disclosure No. 582093, vol. 582, No. 93, Oct. 1, 2012; 4 pages.

Chinese Office Action directed to Chinese Patent Application No. 201980073815.3, dated Oct. 26, 2023; 15 pages.

\* cited by examiner

LITHOGRAPHY SUPPORT CLEANING WITH CLEANING SUBSTRATE HAVING CONTROLLED GEOMETRY AND COMPOSITION

CROSS-REFERENCE TO RELATED APPLICATIONS

This application claims priority of (1) U.S. Provisional Patent Application No. 62/757,837, which was filed on Nov. 9, 2018, and (2) U.S. Provisional Patent Application No. 62/912,971, which was filed on Oct. 9, 2019, both of which are incorporated herein in their entirety by reference.

FIELD

The present disclosure relates to cleaning of devices used to hold a wafer, reticle, mask, or the like in a photolithographic apparatus.

BACKGROUND

A lithographic apparatus applies a desired pattern onto a substrate such as a wafer of semiconductor material. A patterning device, such as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

The lithographic apparatus includes a support structure (e.g., wafer table) having a working surface configured to hold the wafer using, for example, mechanical, vacuum, electrostatic or other clamping techniques. The support structure includes burls configured to support corresponding portions of the wafer. The surface of each of the burls that faces the wafer includes a formation of patterned bumps having dimensions on the order of nanometers. These bumps are referred to as nanobumps herein. The nanobumps define a reduced contacting surface area between the wafer and the burls. The reduced contacting surface area mitigates the sticking effect between the wafer and the burls and modifies friction during the clamping process.

The wafer table and its integral burls are typically made from a Si:SiC composite ceramic material. The wafer table surface may include on the order of 10,000 burls, each having a diameter on the order of hundreds of microns and a height the order of 100 microns. The burls typically cover on the order of 1% of the surface area of the wafer table.

In use, the nanobump working surface may adhere or "stick" to the substrate even when nanostructures are present to avoid such adherence. One mechanism contributing to the adherence is material transfer between the working surface (clamp surface) and a prior substrate. This material contamination is left behind on the working surface in various forms which are referred to herein generically as particles. For example, when the working surface is a reticle clamp and the substrate is a reticle, the reticle clamp may rip chromium from the patterned surface of the reticle causing damage to the reticle. As the dislocated metal accumulates on the clamp surface, reticles may stick and fail to unload.

The accumulated contamination may be removed by removing the working surface from its operational environment (a shift out) and using chemicals to "wet clean" the working surface by dissolving the contamination. It is desirable, however to avoid these steps and the attendant downtime and instead to be able to clean the working surface in-situ.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment, the working surface is cleaned in a controlled manner in situ using tooling. The tooling takes the form of a dedicated cleaning substrate that has a controlled surface, with partial coatings, to remove transferred material (metal contamination) from a textured (nanobumps) working surface. The same mechanism that causes the contamination (material transfer due to locally high contact force) is used in a controlled way to clean the surface.

According to another aspect of an embodiment, the cleaning substrate is configured so that there is a limited contact area between the cleaning substrate and the working surface. This allows a cleaning substrate to be used that may otherwise stick. The coating thickness and geometry (e.g., a raised corner due to coating geometry) may be selected to promote a pealing action, instead of orthogonal pulling. Exploiting the geometry of the surface to be cleaned (for example, high local contact loads on nanobump peaks) can be used to force the contaminant through a surface coating, allowing a bulk material to be exposed, that would otherwise not be useable, such as, for example, a normally prohibited material such as copper or gold, materials that develop a surface oxide (e.g., aluminum and chromium), or non-vacuum compatible materials (e.g., zinc and cadmium) that may be advantageous for cleaning. By limiting the coated area and using different coating materials, coatings can be used to remove contamination.

The use of a cleaning substrate can result in a faster process, that can be performed as a maintenance action (tooling/preventative maintenance) without having to shift the working surface out of its operational environment. The geometry of the cleaning surface on the cleaning substrate can be adapted for a variety of shapes and surfaces of the working surface, e.g., a cleaning wafer with concentric rings.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
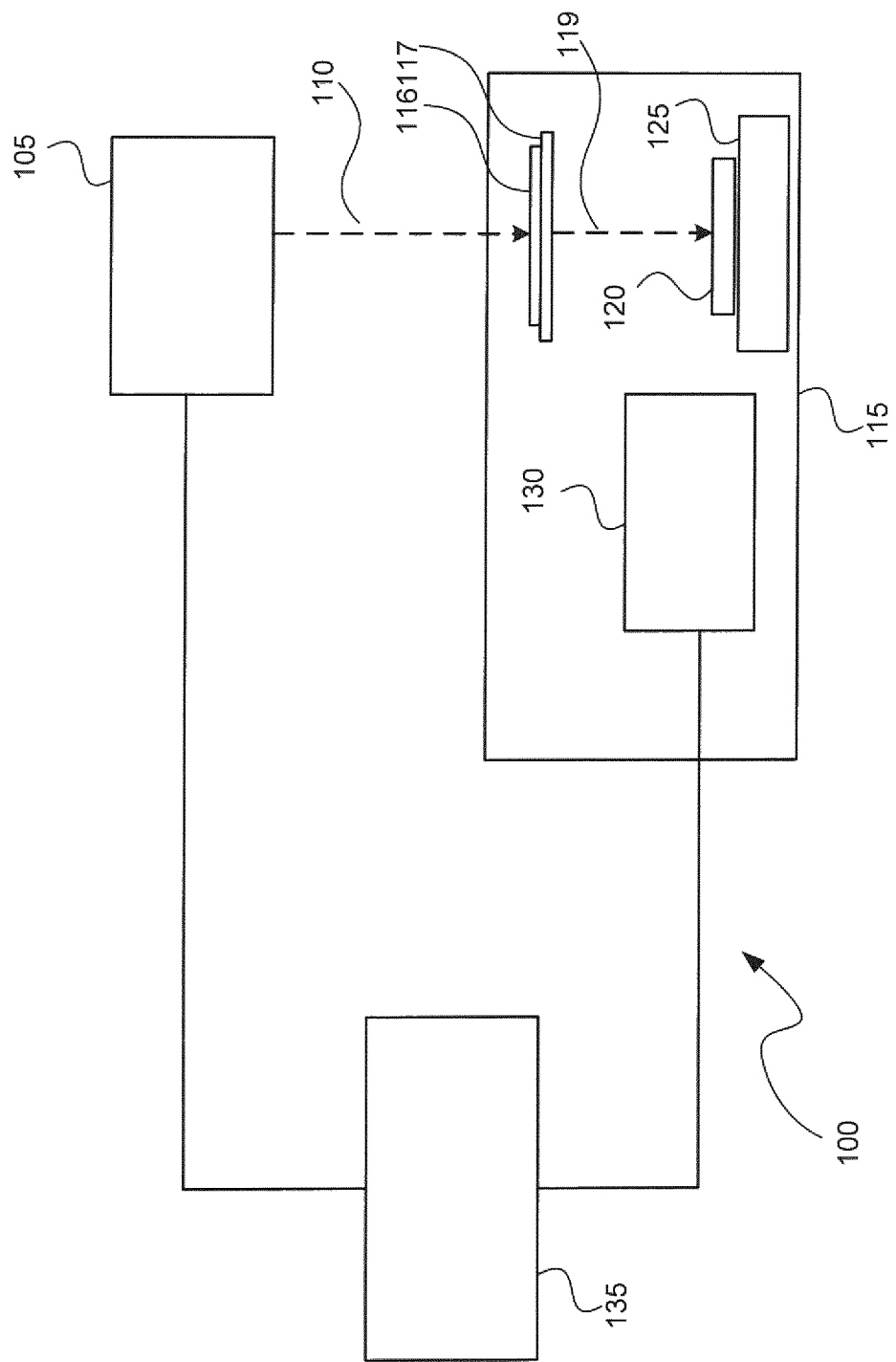
FIG. 1 shows a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

In the description that follows and in the claims the terms "up," "down," "top," "bottom," "vertical," "horizontal," and like terms may be employed. These terms are intended to show relative orientation only and not any orientation with respect to gravity. Similarly, terms such as left, right, front, back, etc., are intended to give only relative orientation.

Before describing embodiments in more detail, it is instructive to present an example environment in which embodiments of the present invention may be implemented.

Referring to FIG. 1, a photolithography system 100 that includes an illumination system 105. The illumination system 105 includes a light source that produces a pulsed light beam 110 and directs it to a photolithography exposure apparatus or scanner 115. The scanner 115 includes a patterning device 116, for example, a mask or reticle, on a support structure 117. The patterning device 116 carries a pattern that is transferred to the beam 110 to create patterned beam 119 that patterns microelectronic features on a wafer 120. The wafer 120 is placed on a wafer table 125 constructed to hold wafer 120 and connected to a positioner configured to accurately position the wafer 120 in accordance with certain parameters.

The photolithography system 100 may use a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. Alternatively, photolithography system 100 may use a light beam 110 having a wavelength in the extreme ultraviolet (EUV) portion of the spectrum, e.g., electromagnetic radiation having wavelengths of around 50 nm or less (also sometimes referred to as soft x-rays), and including light at a wavelength of about 13.5 nm. Here and elsewhere herein the term "light" is used even though it is understood that the radiation described using that term may not in the visible part of the spectrum. Methods for generating EUV light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma can be produced by using a laser beam to irradiate a target material having the required line-emitting element.

The scanner 115 includes an optical arrangement having, for example, one or more condenser lenses, and an objective arrangement. The patterning device 116 is movable along one or more directions, such as along an optical axis of the light beam 110 or in a plane that is perpendicular to the optical axis. The objective arrangement includes a projection lens and enables the image transfer to occur from the patterning device 116 to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the reticle used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The support structure 117 holds the patterning device 116 in a manner that depends on the orientation of the patterning device, the design of the lithographic apparatus, and other conditions, such as for example whether or not the patterning device is held in a vacuum environment. The support structure 117 can use mechanical, vacuum, electrostatic or other clamping techniques to hold the patterning device. The support structure 117 may be a frame or a table, for example, which may be fixed or movable as required. The support structure 117 may ensure that the patterning device 116 is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. As here depicted, the patterning device 116 is of a transmissive type (e.g., employing a transmissive mask). Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

Figure 2:
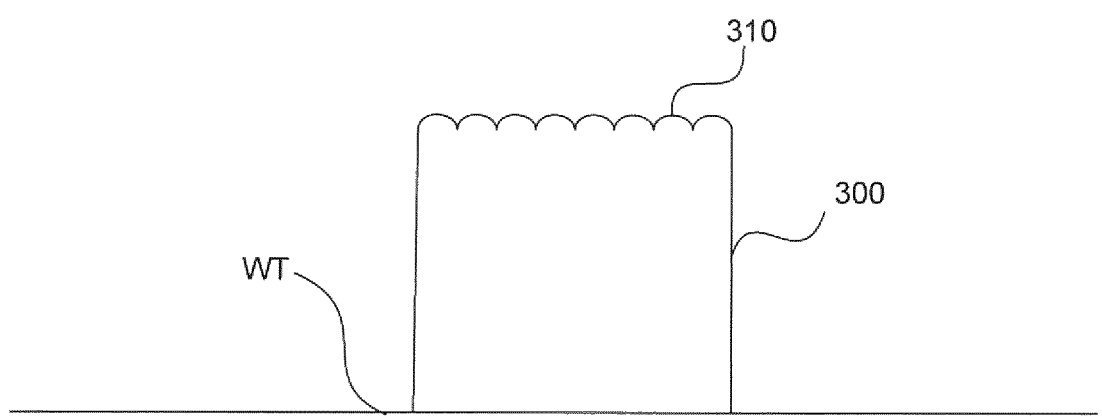
FIG. 2 is a not-to-scale diagram of a burl having a top with a nanoscale topography.

As mentioned, the wafer table may be supplied with an ordered or disordered (random) array of burls, and the top surface (that is, the surface intended to come into contact with the wafer) of each of the burls may be supplied with a topography of nanoscale structures, that is, structures having a feature size on the order on a nanometer or tens of nanometers. This is shown in FIG. 2. FIG. 2 shows a top surface of a wafer table WT having a burl 300. The top surface of the burl 300 has a nanoscale topography 310. The nanoscale topography is shown as an array of hemispherical bumps but it will be understood that other shapes such as pillars may be used. These are all referred to as nanobumps herein.

Figure 3A:
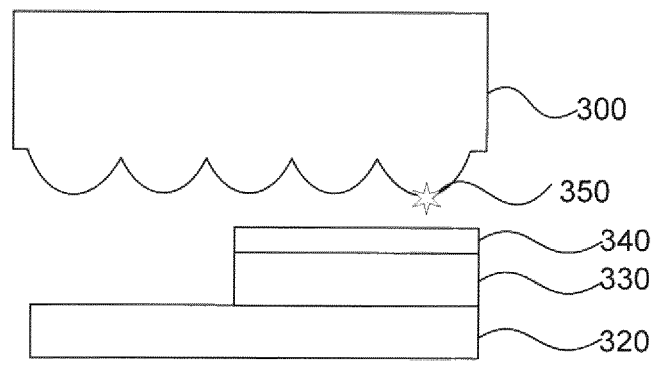
FIGS. 3A, 3B, and 3C are not-to-scale diagrams of the use of a cleaning substrate for removing a particle of contaminant from a working surface according to an aspect of an embodiment.

As shown in FIG. 3A, the substrate 300 has a working surface in the form of a nanobump surface that is, a surface provided with an array of nanobumps. A cleaning substrate 320 is brought into lateral alignment with the substrate 300. At least a portion of the surface of the cleaning substrate 320 confronting the working surface is provided with a coating 330. The coating 330 may be made up of material such as aluminum which forms a surface layer 340 of aluminum oxide. Also visible in FIG. 3A is a particle 350 of contaminant. The particle 350 may be made, for example, of chromium which has adhered to the nanobump surface after being transferred from, for example, a reticle. Particle 350 typically has a size on the order of five microns or smaller.

Figure 3B:
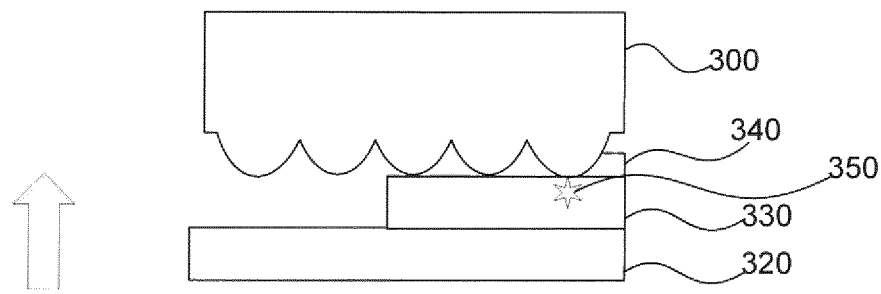
Figure 3C:
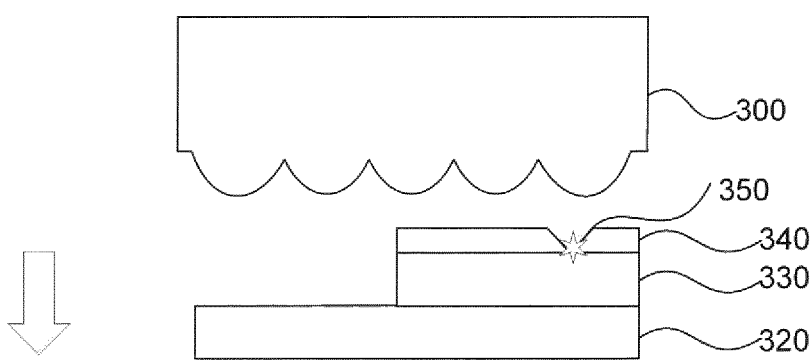

In operation, as shown in FIG. 3B, the cleaning substrate 320 is pressed against the nanobump surface of the substrate 300. Alternatively and equivalently, the nanobump surface of the substrate 300 is pressed against a cleaning substrate 320. The surfaces may be pressed together with sufficient force to cause the particle 350 to penetrate the surface layer 340 and come in contact with the coating 330. Due to both the mechanical action of the particle 350 penetrating the surface layer 340 and the choice of material for the coating 330 the particle 350 dislodges from the nanobump surface and transfers to the coating 330 when the substrate 300 and the cleaning substrate 320 are caused to move away from one another as shown in FIG. 3C.

The above suggests one possible mechanism (the surface layer mechanically trapping particles) by which a surface having a specified geometry and composition can be used to remove contamination. It is not necessary, however, for the contaminant to "punch through" the surface layer. For example, the bulk material (for example, aluminum) beneath the surface layer may be relatively ductile, allowing the surface layer (for example, aluminum oxide) to flex and conform to the contaminant to entrap it. Thus, the surface layer may be adherent in terms of bond energy and the bulk material beneath the surface layer may allow the surface layer to flex around the particle, increasing the surface area in contact, with the effects acting singly or together to promote contaminant removal.

Figure 4:
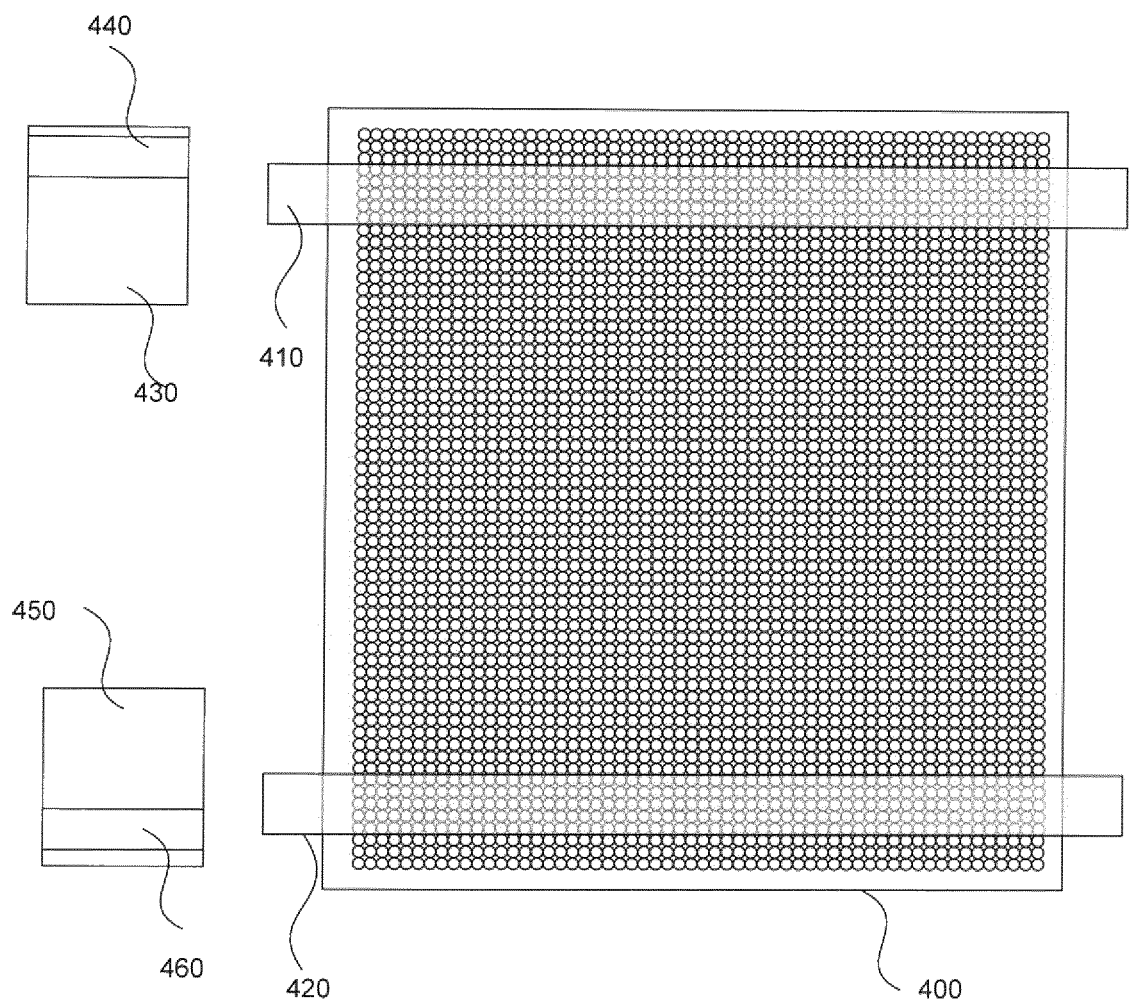
FIG. 4 is a not-to-scale diagram of a process for removing contaminants from a working surface according to an aspect of an embodiment.

The above description is primarily in terms of removing contaminants in the form of particles, but contamination can take other physical forms as well. For example, contamination can be in the form of a monolayers (contamination before it builds up sufficiently to be regarded as a particles) or stain/residues. The particles can be byproducts of use and also unwanted remnants from manufacturing. The teachings of this disclosure may be applied to facilitate removal of all of these types of contaminants In the example shown, the coating 330 covers only part of the substrate 320. If the coating 330 covers the entire area of confrontation with the nanobump surface, then it is possible that the coating 330 will not fully release. It is therefore desirable for some applications to divide the area of the nanobump surface into subregions and to successively use a series of cleaning substrates 320 with coatings in complementary patterns to clean the nanobump surface. This is shown in FIG. 4, in which the working surface 400 having an array of nanobumps is subdivided into multiple regions, for example, region 410 and a region 420. To clean the surface 400 in a region 410, a cleaning substrate 430 having a coating 440 is used. Cleaning substrate 430 is shown in the figure as being smaller than surface for 400, but it will be understood that the surface 400 and cleaning substrate 430 may have substantially the same lateral dimensions. To clean the area 420, a cleaning substrate 450 is used with a coating 460 in an area corresponding to the region 420. Additional cleaning substrates can be used to clean additional areas.

As mentioned, this process can be performed in situ, for example, in a DUV tool the process can be used to remove chromium from a reticle stage. Alternatively, the process may be carried out for initial testing of parts.

As for a choice of material for the coating 330, it is desirable for some applications that the material for the coating 330 have a higher bond dissociation energy for the material one wishes to pull away from the working surface than does the working surface. The bond dissociation energy (enthalpy change) for a bond A–B which is broken through the reaction AB→A+B is defined as the standard-state enthalpy change for the reaction at a specified temperature. This means that chemically the particle will tend to adhere to the material of the coating in preference to the working surface. It is also desirable that material for the coating exhibit a low yield strength so that the particle may penetrate the coating, yield strength being the stress at which a specific amount of plastic deformation is produced. It is also desirable that the material for some applications that the coating have a high Hamaker constant, the Hamaker constant being a material constant that measures the relative strength of the attractive van der Waals forces between two surfaces, here, the surface of the particle and the surface of the coating 330 as experienced through the layer 340.

Candidate materials for the coating in addition to aluminum as described above include, among others, Ti, TiN, Si, SiN, Cr, CrN, CrO, CrNO, AlN, SiO, Ta, TaB, TaN, BO, BN, Cu, Au, and Ag. The thickness of the coating may preferably be in the range of about 0.1 nm to about 1000 nm, and more preferably in the range of about 20 nm to about 500 nm.

Figure 5:
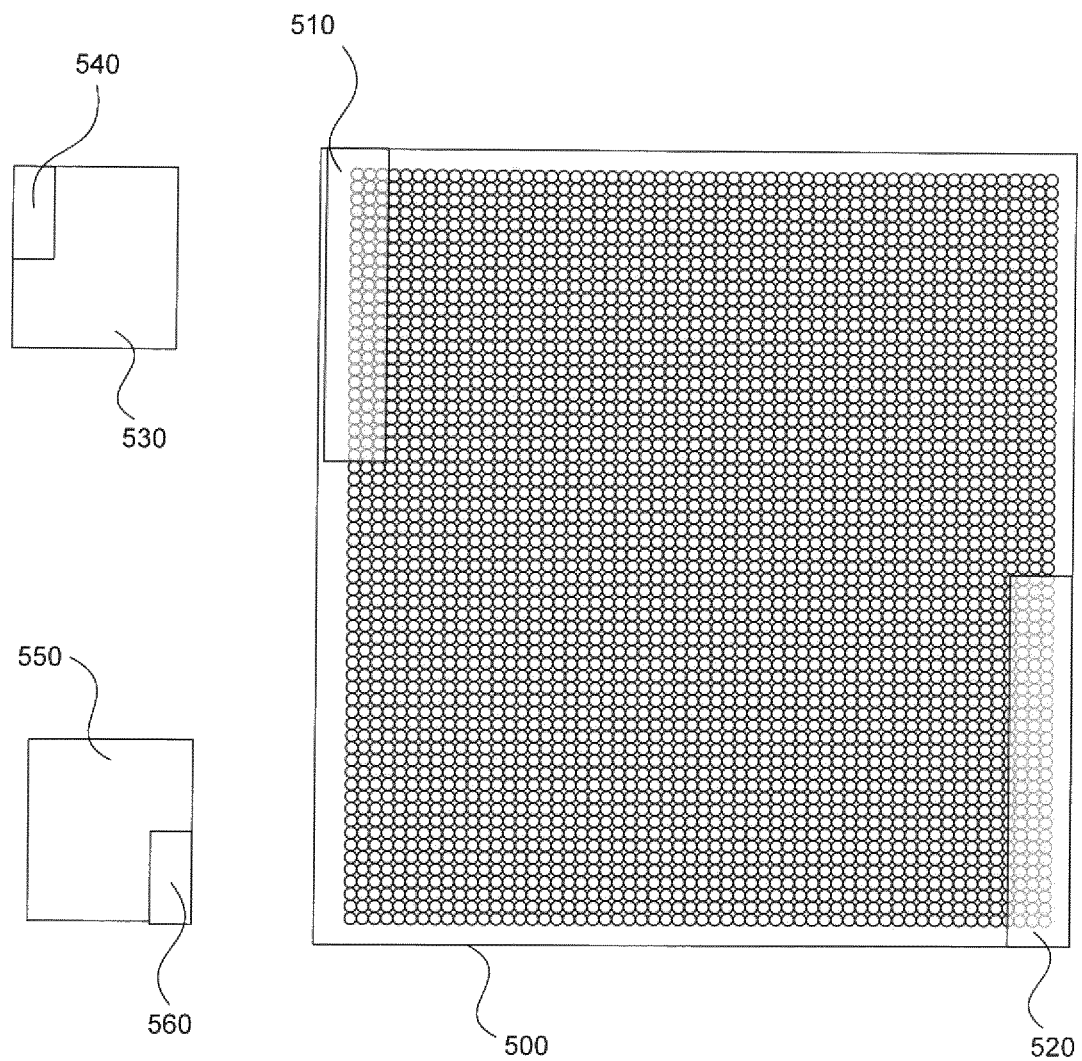
FIG. 5 is a not-to-scale diagram of a process for removing contaminants from a working surface according to an aspect of an embodiment.

FIG. 5 shows another arrangement in which the working surface 500 is divided into subregions 510 and 520. To clean the region 510, the cleaning substrate 530 with coating 540 is brought into opposition to and pressed against the working surface 500. To clean the region 520, a cleaning substrate 550 with a coating 560 is brought into opposition to and pressed against working surface a 500.

According to one aspect of an embodiment, the geometry of the coating is selected to amplify the local pressing force provided by the clamp or chuck. In general there is a limit to the amount of force that can be developed by the clamp or chuck. For example, in an EUV application in which an electrostatic shuck might be used the amount of force that can be developed is limited by the dielectric break down of the insulators used to make the chuck. On the DUV side where a vacuum chuck might be used the amount of force that can be developed is limited by the pressure difference between atmosphere pressure and vacuum. It is, however, possible to use the local geometry of the coating to create local clamping force that is higher than is normally possible.

Figure 6A:
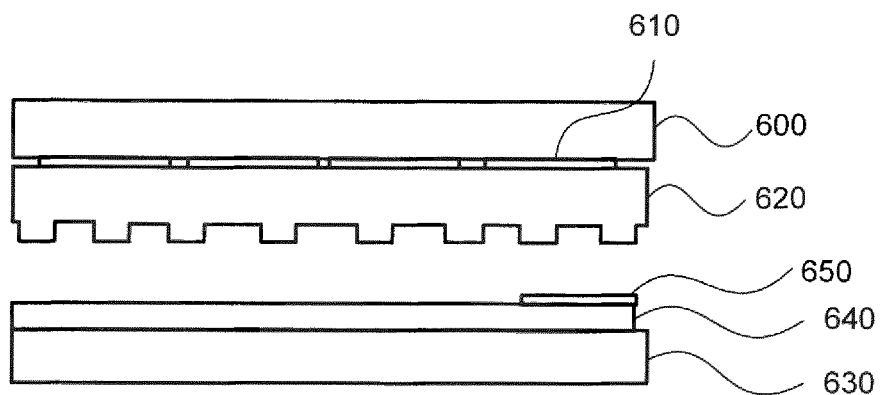
FIGS. 6A, 6B, and 6C are diagrams illustrating principles of operation according to one aspect of an embodiment.
Figure 6B:
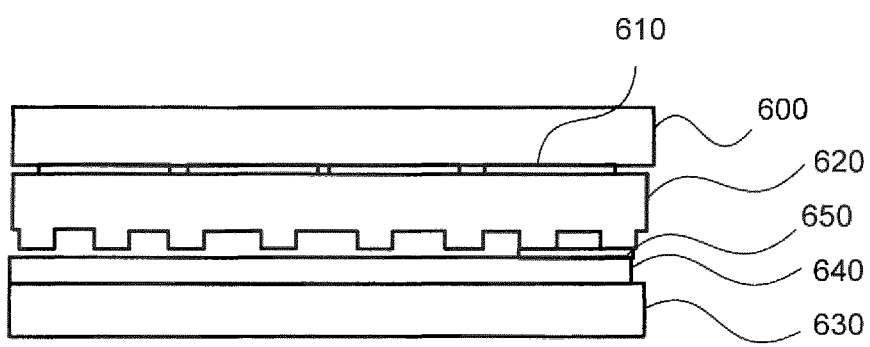
Figure 6C:
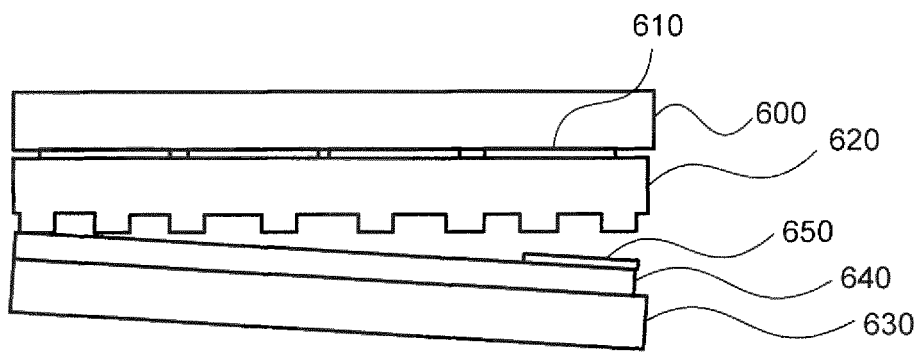

FIGS. 6A, 6B, and 6C are diagrams illustrating these principles. FIGS. 6A, 6B and 6C illustrate an example in the context of an EUV source using an electrostatic chuck. A clamp 600 includes four electrodes 610 and a burled surface 620. A cleaning reticle 630 has a conductive coating 640 which is necessary to effect electrostatic clamping. The cleaning reticle 630 also has a coating 650. In FIG. 6A the clamp 600 and the cleaning reticle 630 are positioned to confront each other. The electrostatic clamp is then energized thus causing the cleaning reticle 630 to be pressed against the burled surface 620 as shown in FIG. 6B. As noted above, the total force exerted by the clamp 600 is limited by the dielectric strength of the materials used to make the clamp 600. The geometry and placement of the coating 650, however, causes the burls on the right side of the burled surface 620 to experience a higher local compressive force during clamping. Also, the lateral extent of the coating 650 is geometrically limited to promote a peeling action of the coating with respect to the burl. When the clamping force is turned off, the coating 650 initiates peeling from a well-defined location as shown in FIG. 6C.

Figure 7:
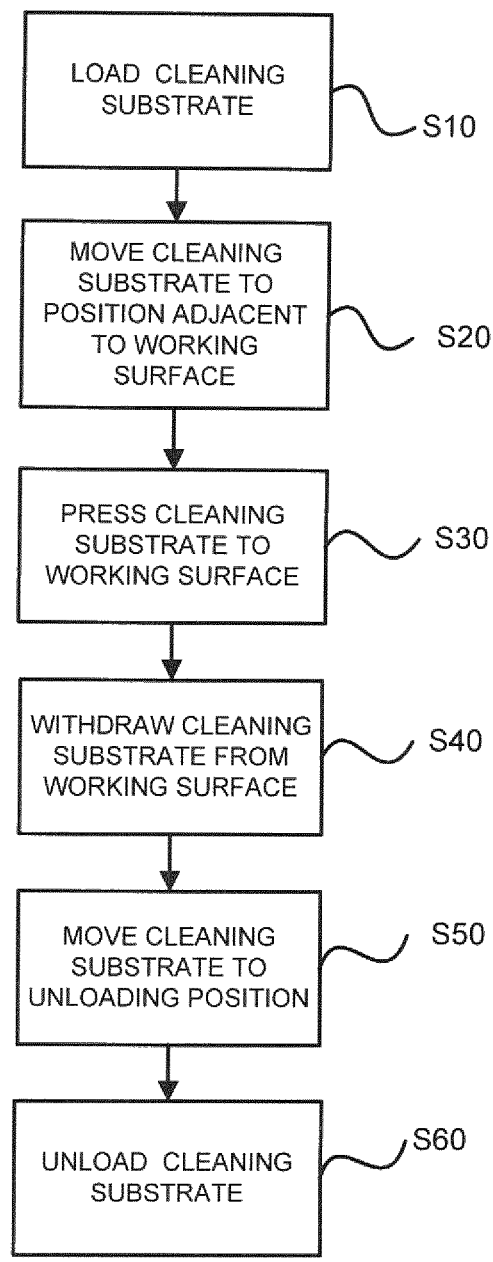
FIG. 7 is a flowchart illustrating a process for removing contaminants from a working surface according to an aspect of an embodiment.

FIG. 7 is a flowchart showing a process of cleaning a working surface using a cleaning substrate as described above. In a step S10 the cleaning substrate is loaded onto a stage. This may be a reticle stage or a wafer stage, for example. In a step S20 the cleaning substrate is moved to a position adjacent to the working surface. In a step S30 the cleaning substrate is pressed against the working surface. In a step S40 the cleaning substrate is withdrawn from contact with the working surface. In a step S50 the cleaning substrate is moved to an unloading position. In a step S60 the cleaning substrate is unloaded.

Figure 8:
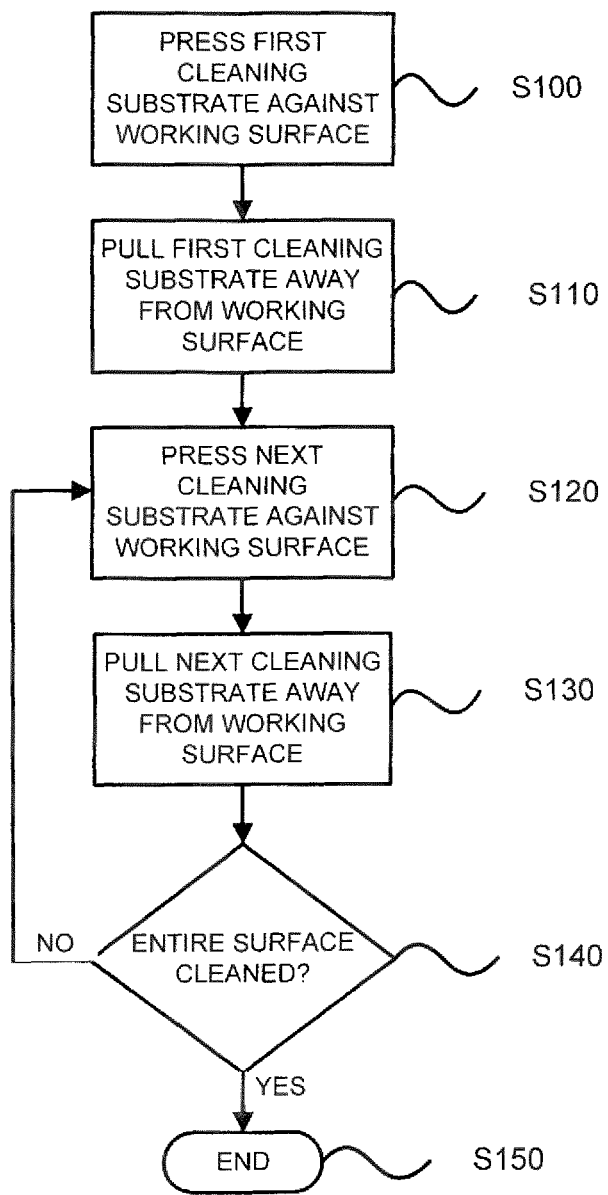
FIG. 8 is a flowchart illustrating a process for removing contaminants from a working surface according to an aspect of an embodiment.

FIG. 8 shows a process in which multiple cleaning substrates (coatings or other cleaning material layers like polyester based wipes etc.) are used to clean a working surface. In a step S100 the first cleaning service of a cleaning substrate is pressed against the working surface. In a step 110, the first cleaning substrate is pulled away from the working surface. In a step S120 a next cleaning substrate is pressed against the working surface. This next cleaning substrate will have a coating in a position different from the position of the coating on the first cleaning substrate to clean a different region of the working surface. In step S130 the next cleaning substrate is pulled away from a working surface. In step S140 it is determined whether all regions of the work surface that is desired to clean have been cleaned. If not, then the process reverts to step S120. If yes, then the process ends.

As noted above, material transfer to support structures such as reticle clamps leads to reticle sticking issues and subsequent membrane failures due to higher required peel force during reticle puffing. The use of nanostructured surfaces exacerbates these challenges. This may be due at least in part to localized increases in contact pressure that arise with the use of nanostructured surfaces.

Regular cleaning of the clamps is thus important to prevent the problems associated with material transfer from worsening by, for example, causing membranes on the reticle clamp to crack. It is known, for example, to use a chrome etchant to remove chrome that has transferred from a reticle to the nanostructured surface of the clamp, e.g., the nanostructured surface of a membrane placed on the clamp. This is a manual service action and cause the user to incur hours of downtime. The foregoing describes at least one in-situ technique for removing the chrome.

According to another aspect of an embodiment, another system and method of in-situ transfer material removal is described. As in the above examples, the transferred material is chrome previously relocated to the reticle clamp from the reticle, but it will be understood that the transferred material could be or include other materials. The system and method involve the use of a dedicated tooling reticle with a coating made of a relatively soft material, for example, aluminum, with a Mohs hardness in the range of about 2.5 to 3. While aluminum will be used as an example in the following description, it will be understood that another similarly soft material may be used for the coating.

The tooling reticle may be deployed in situ in a dry mode in which no solvent is used, or in a wet made in which a solvent such as isopropyl alcohol (IPA) may be used. In either mode relative lateral motion is caused between the tooling reticle and the reticle clamp such that the tooling reticle is scrubbed over the surface of the reticle clamp to remove chrome transferred onto the clamp. The soft coating helps to capture the chrome contamination, while the relative motion dislocates and moves the chrome contamination away from the reticle clamp surface, for example, away from the nanobumps on a nanostructured reticle clamp surface. For in-situ application, the tooling reticle can be held stationary by a reticle handler gripper and while the reticle stage clamps scrub against the tooling reticle.

In general, the lateral shape and size of the tooling reticle may be selected to be about the same as the lateral shape and size of the reticle clamp surface. For some applications, however, it may be advantageous to use a tooling reticle that has a different lateral size and shape. For example, the tooling reticle may be shorter in the translation direction than the confronting surface of the clamp to permit a greater extent or range of relative translation, i.e., scrubbing.

According to another embodiment, transferred material can be removed from the clamps using two tooling reticles sequentially. A first tooling reticle is used to dislocate material that has transferred to the reticle clamp surface and to capture some of the dislocated material. The second tooling reticle is used to sweep away the particles of transferred material dislocated but not captured by the first tooling reticle. These reticles may optionally be provided with reservoirs for a cleaning fluid such as IPA to be able to operate in a wet mode. The second reticle can be at least partially covered with a sheet of material soaked with a cleaning solution, e.g., a cleanroom wipe, attached to it which will serve to capture any loose dislocated particles and slide it away from the clamps.

Figure 9:
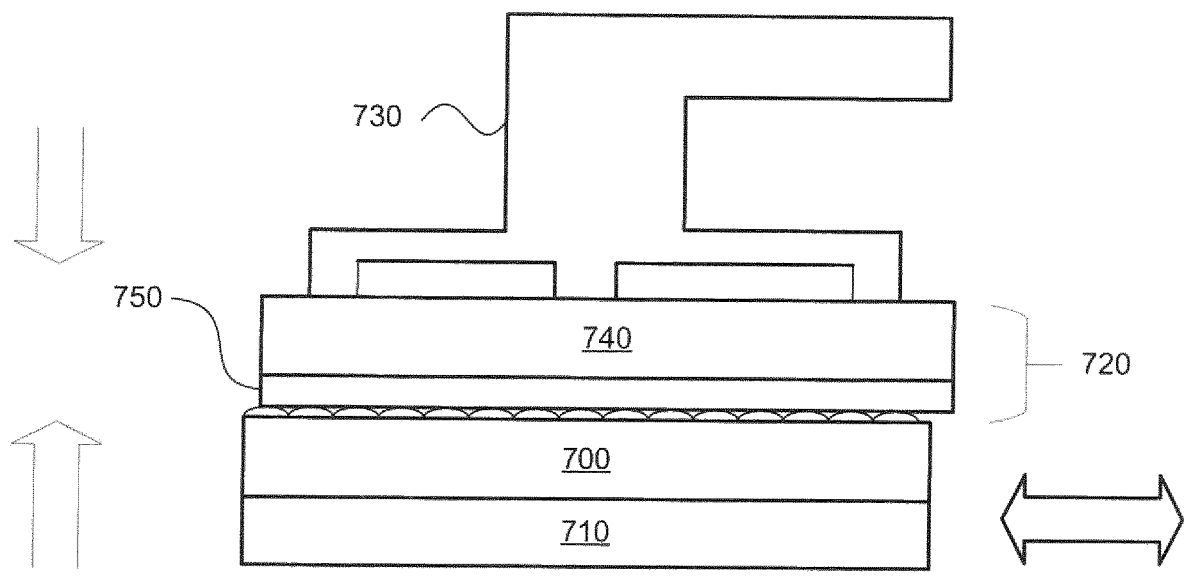
FIG. 9 is a not-to-scale diagram of a cleaning substrate for removing a particle of contaminant from a working surface according to an aspect of an embodiment.

Thus, as shown in FIG. 9, a reticle stage clamp 700 is supported by a reticle stage 710. The surface of the reticle stage clamp 700 that confronts a reticle in the example shown has a nanostructure in the form of nanobumps, the size of which have been exaggerated in the figure for clarity. As discussed above this surface may be contaminated with material such as chromium from reticles which the reticle stage clamp has previously been used to secure. To remove this transferred material, a tooling reticle 720 is held in position by a reticle handler 730. The tooling reticle 720 includes a substrate 740 made of, for example, fused silica. The substrate 740 is provided with a coating 750 made of, for example, a soft material such as aluminum. The vertical arrows to the left of the figure indicate the clamping force that the reticle clamps experience due to vacuum being drawn from the clamp area. To make sure that scrubbing is still possible with such clamping forces, the amount of vacuum being drawn is lower than that during normal reticle clamping. The clamp is compliant in nature and thus the vacuum forces the clamp to contact the reticle and to comply with is geometry. The horizontal arrow to the right of the figure indicates moving the reticle stage 710 laterally while keeping the tooling reticle 720 stationary to induce relative motion between the two so that the tooling reticle 740 effectively scrubs the upper surface of the clamp 700. The reticle can also be made up of a low stiffness material like plastics so as to also conform to the geometry of the clamp assemblies which might have pre-existing rotational tilts about the translation axis.

Figure 10:
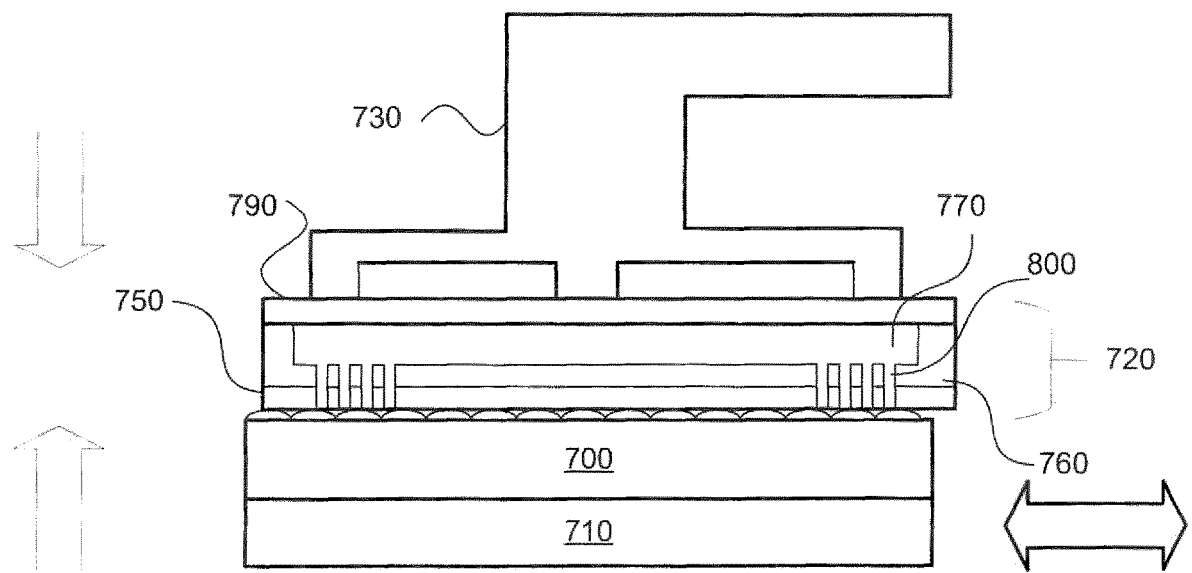
FIG. 10 is a not-to-scale diagram of a cleaning substrate for removing a particle of contaminant from a working surface according to an aspect of an embodiment.
Figure 11:
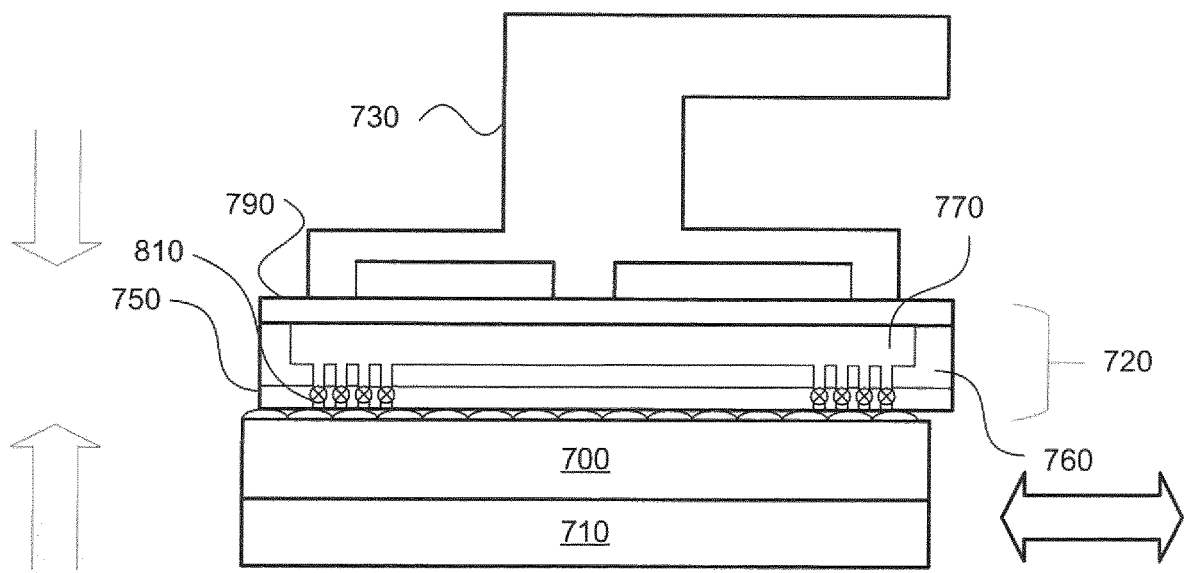
FIG. 11 is a not-to-scale diagram of a cleaning substrate for removing a particle of contaminant from a working surface according to an aspect of an embodiment.

As shown in FIG. 10, in which like numerals reference similar structures, instead of providing the tooling reticle 720 with a solid substrate of fused silica, a substrate 760 may be provided with a cutout that defines a reservoir 770. The reservoir 770 may contain a cleaning solution such as isopropyl alcohol. The reservoir 770 may be in fluid communication with the confronting surface of the coating 750 through a series of channels 800 as shown. The cleaning solution may be delivered through the channels 800 by means of capillary action. Alternatively, the cleaning fluid may be delivered by operation of one or more valves 810 (FIG. 11). The valves 810 may be actuated by various ways including mechanical, pneumatic and electrical actuation. Also shown in FIG. 10 is a tooling reticle cover 790. In operation, the tooling reticle 720 is held in place while the reticle stage 710 is moved laterally to cause a relative translational scrubbing motion. The relative translation motion can be unidirectional or bidirectional. At the same time, the cleaning fluid is dispensed from the reservoir 770.

The embodiments may further be described using the following clauses:

1. In a system for generating radiation for use in photolithography, apparatus comprising
   a clamping structure comprising a working surface; and
   a cleaning substrate for removing a contaminant from the working surface, the cleaning substrate comprising:
   a base having a lateral surface; and
   a coating on at least part of the lateral surface.
2. Apparatus of clause 1 wherein the coating comprises a surface layer and a bulk material.
3. Apparatus of clause 1 or clause 2 wherein the working surface comprises a reticle stage and the cleaning substrate comprises a cleaning reticle.
4. Apparatus of clause 1 or clause 2 wherein the working surface comprises a wafer table and the cleaning substrate comprises a cleaning wafer.
5. A cleaning substrate for removing particles of a contaminant comprising a first material from a working surface comprising a second material, the cleaning substrate comprising:
   a base having a lateral surface; and
   a coating on at least part of the lateral surface, the coating comprising a third material, wherein a bond dissociation energy of a bond between the first material and the second material is less than a bond dissociation energy of a bond between the second material and the third material.
6. A cleaning substrate of clause 5 wherein the working surface comprises a reticle stage and the cleaning substrate comprises a cleaning reticle.
7. A cleaning substrate of clause 5 wherein the working surface comprises a wafer table and the cleaning substrate comprises a cleaning wafer.
8. A cleaning substrate of clause 5 wherein the first material comprises silicon.
9. A cleaning substrate of clause 8 wherein the second material comprises chromium.
10. A cleaning substrate of clause 9 wherein the third material comprises aluminum.
11. A cleaning substrate of clause 5 wherein the third material has a low yield strength.
12. A cleaning substrate of clause 5 wherein the third material has a high Hamaker constant.
13. A method of removing a contaminant from a working surface of a clamping structure in a photolithography tool, the method comprising the steps of:
   pressing a cleaning substrate against the working surface, the cleaning substrate comprising a base having a lateral surface and a coating on at least part of the lateral surface; and
   moving the cleaning substrate away from the working surface to remove the contaminant from the working surface.
14. A method of clause 13 wherein the working surface comprises a reticle stage and the cleaning substrate comprises a cleaning reticle.

15. A method of clause 13 wherein the working surface comprises a wafer table and the cleaning substrate comprises a cleaning wafer.

16. A method of clause 13 wherein the moving step is carried out in such a way as to cause a peeling action between the coating and the working surface.

17. A method of removing particles of a contaminant comprising a first material from a working surface comprising a second material, the method comprising the steps of:
 pressing a cleaning substrate against the working surface, the cleaning substrate comprising a base having a lateral surface and a coating on at least part of the lateral surface, the coating comprising a third material, wherein a bond dissociation energy of a bond between the first material and the second material is less than a bond dissociation energy of a bond between the second material and the third material, so that the contaminant transfers from the working surface to the coating; and
 moving the cleaning substrate away from the working surface to remove the contaminant from the working surface.

18. A method of clause 17 wherein the working surface comprises a reticle stage and the cleaning substrate comprises a cleaning reticle.

19. A method of clause 17 wherein the working surface comprises a wafer table and the cleaning substrate comprises a cleaning wafer.

20. A method of clause 17 wherein the first material comprises silicon.

21. A method of clause 20 wherein the second material comprises chromium.

22. A method of clause 21 wherein the third material comprises aluminum.

23. A method of clause 17 wherein the third material has a low yield strength.

24. A method of clause 17 wherein the third material has a high Hamaker constant.

25. A method of removing particles of a contaminant of clause 13 or 17 wherein the steps are repeated a plurality of times to remove the contaminant from substantially all of the working surface.

26. A method of clause 13 or 17 wherein the working surface is located in a vacuum chamber and wherein the method further comprises the steps of:
 a step, before the pressing step, of moving the cleaning substrate to a position adjacent to the working surface and
 a step, after the moving step, of repositioning the cleaning substrate to a position where the cleaning substrate can be unloaded.

27. A method of removing a contaminant from a working surface, the method comprising the steps of:
 (a) pressing a first cleaning substrate against a first portion of the working surface, the cleaning substrate comprising a base having a lateral surface and a first coating on at least part of the lateral surface and having a lateral size and shape corresponding to a size and shape of the first portion, so that the contaminant transfers from the first portion to the first coating;
 (b) moving the first cleaning substrate away from the working surface to remove the contaminant from the first portion of the working surface;
 (c) pressing a second cleaning substrate against a second portion of the working surface, the second cleaning substrate comprising a base having a lateral surface and a second coating on at least part of the lateral surface and having a lateral size and shape corresponding to a size and shape of the second portion, so that the contaminant transfers from the second portion to the second coating; and
 (d) moving the second cleaning substrate away from the working surface to remove the contaminant from the second portion of the working surface.

28. A method of removing particles of a contaminant comprising a first material from a working surface comprising a second material, the method comprising the steps of:
 (a) pressing a first cleaning substrate against a first portion of the working surface, the cleaning substrate comprising a base having a lateral surface and a first coating on at least part of the lateral surface and having a lateral size and shape corresponding to a size and shape of the first portion, the first coating comprising a third material, wherein a bond dissociation energy of a bond between the first material and the second material is less than a bond dissociation energy of a bond between the second material and the third material, so that the contaminant transfers from the first portion to the first coating;
 (b) moving the first cleaning substrate away from the working surface to remove the contaminant from the first portion of the working surface;
 (c) pressing a second cleaning substrate against a second portion of the working surface, the second cleaning substrate comprising a base having a lateral surface and a second coating on at least part of the lateral surface and having a lateral size and shape corresponding to a size and shape of the second portion, the second coating comprising a third material, wherein a bond dissociation energy of a bond between the first material and the second material is less than a bond dissociation energy of a bond between the second material and the third material, so that the contaminant transfers from the second portion to the second coating; and
 (d) moving the second cleaning substrate away from the working surface to remove the contaminant from the second portion of the working surface.

29. A method of removing particles of a contaminant of clause 28 wherein the steps (a) through (d) are repeated a plurality of times to remove the contaminant from substantially all of the working surface.

30. In a system for generating radiation for use in photolithography, apparatus comprising
 a clamping structure comprising a working surface; and
 a cleaning substrate for removing a contaminant from the working surface, the cleaning substrate comprising a base having a lateral surface and a coating on at least part of the lateral surface, the coating comprising a metal having a Mohs hardness less than 5.

31. Apparatus of clause 30 wherein the working surface comprises a reticle stage and the cleaning substrate comprises a cleaning reticle.

32. Apparatus of clause 30 wherein the working surface comprises a wafer table and the cleaning substrate comprises a cleaning wafer.

33. In a system for generating radiation for use in photolithography, apparatus comprising:
 a clamping structure comprising a working surface; and
 a cleaning substrate for removing a contaminant from the working surface, the cleaning substrate comprising:
 a base having a surface,
 a coating on at least part of the surface, the coating comprising a metal having a Mohs hardness less than 5, a reservoir within the cleaning substrate adapted to hold a cleaning fluid, and a plurality of channels arranged to place the reservoir in fluid communication with an exterior portion of the coating.

34. A cleaning substrate for removing a contaminant from the working surface, the cleaning substrate comprising:

a base having a surface;

a coating on at least part of the surface, the coating comprising a metal having a Mohs hardness less than 5;

a reservoir within the cleaning substrate adapted to hold a cleaning fluid; and a plurality of channels arranged to place the reservoir in fluid communication with an exterior portion of the coating.

35. A cleaning substrate of clause 34 wherein the working surface comprises a reticle stage and the cleaning substrate comprises a cleaning reticle.

36. A cleaning substrate of clause 34 wherein the working surface comprises a wafer table and the cleaning substrate comprises a cleaning wafer.

37. A method of removing a contaminant from a working surface of a clamping structure in a photolithography tool, the method comprising the steps of:

pressing a cleaning substrate against the working surface, the cleaning substrate comprising a base having a lateral surface and a coating on at least part of the lateral surface;

causing relative translational motion between the cleaning substrate and the working surface; and moving the cleaning substrate away from the working surface.

38. A method of clause 37 wherein the working surface comprises a reticle stage and the cleaning substrate comprises a cleaning reticle.

39. A method of clause 37 wherein the working surface comprises a wafer table and the cleaning substrate comprises a cleaning wafer.

40. A method of clause 37 further comprising a step after the pressing step of introducing a cleaning fluid between the cleaning substrate and the working surface.

41. A method of removing a contaminant from a working surface of a clamping structure in a photolithography tool, the method comprising the steps of:

providing a piece of flexible material having a wet chemical etchant adsorbed therein;

attaching the piece of flexible material to a cleaning reticle;

pressing the cleaning reticle with the attached piece of flexible material against the working surface; and moving the cleaning reticle with the attached piece of flexible material away from the working surface.

42. A method of clause 41 further comprising the steps after the moving step of removing the piece of flexible material from the cleaning reticle;

providing a second piece of flexible material having a rinsing agent adsorbed therein;

attaching the second piece of flexible material to a cleaning reticle; and pressing the cleaning reticle with the attached second piece of flexible material against the working surface.

43. A method of clause 42 further comprising a step after the pressing step of causing relative motion of the cleaning reticle and the working surface.

44. A method of clause 41 wherein the flexible material comprises a polyester material.

45. A method of clause 43 wherein the rinsing agent comprises isopropyl alcohol.

46. A method of clause 43 wherein the rinsing agent comprises de-ionized water.

47. A method of removing particles of a contaminant from a working surface, the method comprising the steps of:

pressing a cleaning substrate against the working surface, the cleaning substrate comprising a base having a lateral surface and a coating on at least part of the lateral surface;

causing relative translational motion between the cleaning substrate and the working surface; and moving the cleaning substrate away from the working surface.

48. A method of clause 47 wherein the working surface comprises a reticle stage and the cleaning substrate comprises a cleaning reticle.

49. A method of clause 47 wherein the working surface comprises a wafer table and the cleaning substrate comprises a cleaning wafer.

50. A method of clause 47 further comprising a step after the pressing step of introducing a cleaning fluid between the cleaning substrate and the working surface.

51. A method of clause 47 wherein the steps are repeated a plurality of times to remove the contaminant from substantially all of the working surface.

52. A method of clause 47 wherein the working surface is located in a vacuum chamber and wherein the method further comprises the steps of:

a step, before the pressing step, of moving the cleaning substrate to a position adjacent to the working surface and a step, after the moving step, of repositioning the cleaning substrate to a position where the cleaning substrate can be unloaded.

53. A method of removing a contaminant from a working surface, the method comprising the steps of:

(a) pressing a first cleaning substrate against a first portion of the working surface, the cleaning substrate comprising a base having a lateral surface and a first coating on at least part of the lateral surface and having a lateral size and shape corresponding to a size and shape of the first portion, so that the contaminant transfers from the first portion to the first coating;

(b) causing relative translational motion between the cleaning substrate and the working surface;

(c) moving the first cleaning substrate away from the working surface to remove the contaminant from the first portion of the working surface;

(d) pressing a second cleaning substrate against a second portion of the working surface, the second cleaning substrate comprising a base having a lateral surface and a second coating on at least part of the lateral surface and having a lateral size and shape corresponding to a size and shape of the second portion, so that the contaminant transfers from the second portion to the second coating;

(e) causing relative translational motion between the second cleaning substrate and the working surface; and (f) moving the second cleaning substrate away from the working surface to remove the contaminant from the second portion of the working surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the present invention have been described above, it will be appreciated that the present invention may be practiced other than as described. The descriptions above are intended to be illustrative, not limiting. Thus it will be apparent to one skilled in the art that modifications may be made to the present invention as described without departing from the scope of the claims that follow.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An apparatus comprising:
   a clamping structure comprising a working surface, wherein the working surface comprises a plurality of burls; and
   a cleaning substrate configured to remove a contaminant from the working surface, the cleaning substrate comprising:
   a base having a lateral surface; and
   a coating on only a part of the lateral surface,
   wherein the coating forms a single raised surface for removing the contaminant and a remaining part of the lateral surface is uncoated, and
   wherein the remaining part of the lateral surface is located in an inner portion of a confrontation area with the working surface.

2. The apparatus of claim 1, wherein the coating comprises a surface layer and a bulk material.

3. The apparatus of claim 1, wherein:
   the working surface comprises a reticle stage; and
   the cleaning substrate comprises a cleaning reticle.

4. The apparatus of claim 1, wherein:
   the working surface comprises a wafer table; and
   the cleaning substrate comprises a cleaning wafer.

5. A cleaning substrate for removing particles of a contaminant comprising a first material from a working surface comprising a second material, wherein the working surface comprises a plurality of burls, the cleaning substrate comprising:
   a base having a lateral surface;
   a conductive coating covering the lateral surface; and
   a coating on at least part of a top surface of the conductive coating, the coating comprising a third material and a raised corner for removing particles of the contaminant and the coating only covering a part of the conductive coating,
   wherein an uncoated part of the top surface of the conductive coating is located in an inner portion of a confrontation area with the working surface, and
   wherein a bond dissociation energy of a bond between the first material and the second material is less than a bond dissociation energy of a bond between the second material and the third material.

6. The cleaning substrate of claim 5, wherein:
   the working surface comprises a reticle stage; and
   the cleaning substrate comprises a cleaning reticle.

7. The cleaning substrate of claim 5, wherein:
   the working surface comprises a wafer table; and
   the cleaning substrate comprises a cleaning wafer.

8. The cleaning substrate of claim 5, wherein the third material comprises silicon.

9. The cleaning substrate of claim 5, wherein the third material comprises chromium.

10. The cleaning substrate of claim 5, wherein the third material comprises aluminum.

11. The cleaning substrate of claim 5, wherein the third material has a yield strength, such that a particle may penetrate the coating.

12. The cleaning substrate of claim 5, wherein a Hamaker constant between the coating and a particle is high, such that the particle is attracted to the coating.

13. A method of removing a contaminant comprising:
   pressing a cleaning substrate against a working surface of a clamping structure in a photolithography tool, the cleaning substrate comprising a base having a lateral surface and a coating on only a part of the lateral surface, wherein:
   the coating forms a single raised surface for removing the contaminant and a remaining part of the lateral surface is uncoated,
   the working surface comprises a plurality of burls, and
   the remaining part of the lateral surface is located in an inner portion of a confrontation area with the working surface; and moving the cleaning substrate away from the working surface to remove the contaminant from the working surface.

14. The method of claim 13, further comprising using a reticle stage with the working surface and a cleaning reticle as the cleaning substrate.

15. The method of claim 13, further comprising using a wafer table with the working surface and a cleaning wafer as the cleaning substrate.

16. The method of claim 13, wherein the moving is carried out in such a way as to cause a peeling action between the coating and the working surface.

17. The method of claim 13, wherein the pressing and moving are repeated a plurality of times to remove the contaminant from substantially all of the working surface.

18. The method of claim 13, wherein:
the working surface is located in a vacuum chamber and wherein the method further comprises:
before the pressing, moving the cleaning substrate to a position adjacent to the working surface; and
after the moving, repositioning the cleaning substrate to a position where the cleaning substrate can be unloaded.

19. A method of removing particles of a contaminant comprising a first material from a working surface comprising a second material, the method comprising:
pressing a cleaning substrate against the working surface, wherein the working surface comprises a plurality of burls, the cleaning substrate comprising a base having a lateral surface, a conductive coating covering the lateral surface, and a coating on at least part of a top surface of the conductive coating, the coating comprising a third material and a raised corner for removing particles of the contaminant and the coating only covering a part of the base, wherein an uncoated part of the top surface of the conductive coating is located in an inner portion of a confrontation area with the working surface and wherein a bond dissociation energy of a bond between the first material and the second material is less than a bond dissociation energy of a bond between the second material and the third material, such that the contaminant transfers from the working surface to the coating; and
moving the cleaning substrate away from the working surface to remove the contaminant from the working surface.

20. The method of claim 19, further comprising using a reticle stage with the working surface and a cleaning reticle as the cleaning substrate.

21. The method of claim 19, further comprising using a wafer table with the working surface and a cleaning wafer as the cleaning substrate.

22. The method of claim 19, further comprising using silicon as the third material.

23. The method of claim 19, further comprising using chromium as the third material.

24. The method of claim 19, further comprising using aluminum as the third material.

25. The method of claim 19, wherein the third material has a yield strength, such that a particle may penetrate the coating.

26. The method of claim 19, wherein a Hamaker constant between the coating and a particle is high, such that the particle is attracted to the coating.

27. A method of removing a contaminant from a working surface comprising:
pressing a first cleaning substrate against a first portion of the working surface, the cleaning substrate comprising a base having a lateral surface and a first coating on at least part of the lateral surface including a single raised surface for removing the contaminant and the coating only covering a part of the base and having a lateral size and shape corresponding to a size and shape of the first portion, so that the contaminant transfers from the first portion to the first coating, wherein the working surface comprises a plurality of burls;
moving the first cleaning substrate away from the working surface to remove the contaminant from the first portion of the working surface;
pressing a second cleaning substrate against a second portion of the working surface, the second cleaning substrate comprising a base having a lateral surface and a second coating on at least part of the lateral surface including a single raised surface and having a lateral size and shape corresponding to a size and shape of the second portion, so that the contaminant transfers from the second portion to the second coating, wherein respective remaining parts of the lateral surface of the first cleaning substrate and the lateral surface of the second cleaning substrate are uncoated, and wherein the respective remaining parts are located in an inner portion of a confrontation area with the working surface; and
moving the second cleaning substrate away from the working surface to remove the contaminant from the second portion of the working surface.

28. A method of removing particles of a contaminant comprising a first material from a working surface comprising a second material, the method comprising:
pressing a first cleaning substrate against a first portion of the working surface, the cleaning substrate comprising a base having a lateral surface, a conductive coating covering the lateral surface, and a first coating on at least part of a top surface of the conductive coating including a raised corner for removing the contaminant and the coating only covering a part of the base and having a lateral size and shape corresponding to a size and shape of the first portion, the first coating comprising a third material, wherein the working surface comprises a plurality of burls, a bond dissociation energy of a bond between the first material and the second material is less than a bond dissociation energy of a bond between the second material and the third material, so that the contaminant transfers from the first portion to the first coating;
moving the first cleaning substrate away from the working surface to remove the contaminant from the first portion of the working surface;
pressing a second cleaning substrate against a second portion of the working surface, the second cleaning substrate comprising a base having a lateral surface, a conductive coating covering the lateral surface, and a second coating on at least part of a top surface of the conductive coating including a raised corner and having a lateral size and shape corresponding to a size and shape of the second portion, the second coating comprising a third material, wherein an uncoated part of the top surface of the conductive coating is located in an inner portion of a confrontation area with the working surface, and wherein a bond dissociation energy of a bond between the first material and the second material is less than a bond dissociation energy of a bond between the second material and the third material, so that the contaminant transfers from the second portion to the second coating; and moving the second cleaning substrate away from the working surface to remove the contaminant from the second portion of the working surface.

29. The method of removing particles of the contaminant of claim 28, wherein the pressing and moving steps are repeated a plurality of times to remove the contaminant from substantially all of the working surface.

\* \* \* \* \*